United States Patent
Liddiard

(10) Patent No.: US 7,791,026 B2
(45) Date of Patent: Sep. 7, 2010

(54) MICROBOLOMETER INFRARED SECURITY SENSOR

(76) Inventor: Kevin Liddiard, 18 Ferrier Ave., Fairview Park, South Australia (AU) 5126

( * ) Notice: Subject to any disclaimer, the term of this patent is extended or adjusted under 35 U.S.C. 154(b) by 110 days.

(21) Appl. No.: 11/817,165

(22) PCT Filed: Feb. 24, 2006

(86) PCT No.: PCT/AU2006/000232

§ 371 (c)(1),
(2), (4) Date: Aug. 27, 2007

(87) PCT Pub. No.: WO2006/108210

PCT Pub. Date: Oct. 19, 2006

(65) Prior Publication Data

US 2009/0121137 A1    May 14, 2009

(30) Foreign Application Priority Data

Feb. 25, 2005   (AU) .............................. 2005900891

(51) Int. Cl.
*G01J 5/00* (2006.01)
(52) U.S. Cl. .................................................. 250/338.1
(58) Field of Classification Search .... 250/338.1–338.5
See application file for complete search history.

(56) References Cited

U.S. PATENT DOCUMENTS

| | | | | | |
|---|---|---|---|---|---|
| 4,300,048 | A | * | 11/1981 | Barbier et al. | 250/338.1 |
| 4,902,894 | A | * | 2/1990 | Butler et al. | 250/338.1 |
| 4,905,292 | A | * | 2/1990 | Wentworth et al. | 382/103 |
| 5,130,543 | A | * | 7/1992 | Bradbeer | 250/342 |
| 5,367,167 | A | * | 11/1994 | Keenan | 250/338.4 |
| 5,373,320 | A | * | 12/1994 | Johnson et al. | 348/217.1 |
| 5,675,149 | A | * | 10/1997 | Wood et al. | 250/332 |
| 6,465,785 | B1 | * | 10/2002 | McManus | 250/338.1 |
| 6,747,275 | B2 | * | 6/2004 | Raper et al. | 250/342 |
| 7,391,907 | B1 | * | 6/2008 | Venetianer et al. | 382/224 |
| 2002/0017608 | A1 | * | 2/2002 | Pyyhtia et al. | 250/370.08 |
| 2003/0115096 | A1 | * | 6/2003 | Reynolds et al. | 705/14 |
| 2003/0168599 | A1 | * | 9/2003 | Liddiard | 250/338.1 |
| 2004/0200961 | A1 | * | 10/2004 | Parrish et al. | 250/338.1 |
| 2005/0043630 | A1 | * | 2/2005 | Buchert | 600/473 |

OTHER PUBLICATIONS

Neilson et al., "Design and performance of an uncooled radiometer," 1998, Proceedings of SPIE, vol. 3379, pp. 79-89.*
Liddiard et al., "Progress of Swedish-Australian research collaboration on uncooled smart IR sensors," 1998, Proceedings of SPIE, vol. 3436, pp. 578-584.*
He et al., "Performance of Microbolometer Focal Plane Arrays Under Varying Pressure," 2000, IEEE Electron Device Letters, vol. 21, No. 5, pp. 233-235.*

* cited by examiner

*Primary Examiner*—David P Porta
*Assistant Examiner*—Kiho Kim
(74) *Attorney, Agent, or Firm*—Robert S. Smith

(57) ABSTRACT

An infrared sensor, comprising a focal plane array (FPA) of resistance microbolometer infrared detectors connected in such a manner to produce different pixel formats to meet specific detection requirements. Typically each imaging pixel may be a mosaic comprising a number of sub-pixels connected in parallel (although other configurations are possible), resulting in enhanced performance and ease of manufacture by micro-fabrication methods. The FPA may be integrated with a readout microcircuit on the same substrate so that with appropriate signal processing one is capable of forming an image of the field of view of interest, facilitating target recognition and very low false alarm rate.

21 Claims, 4 Drawing Sheets

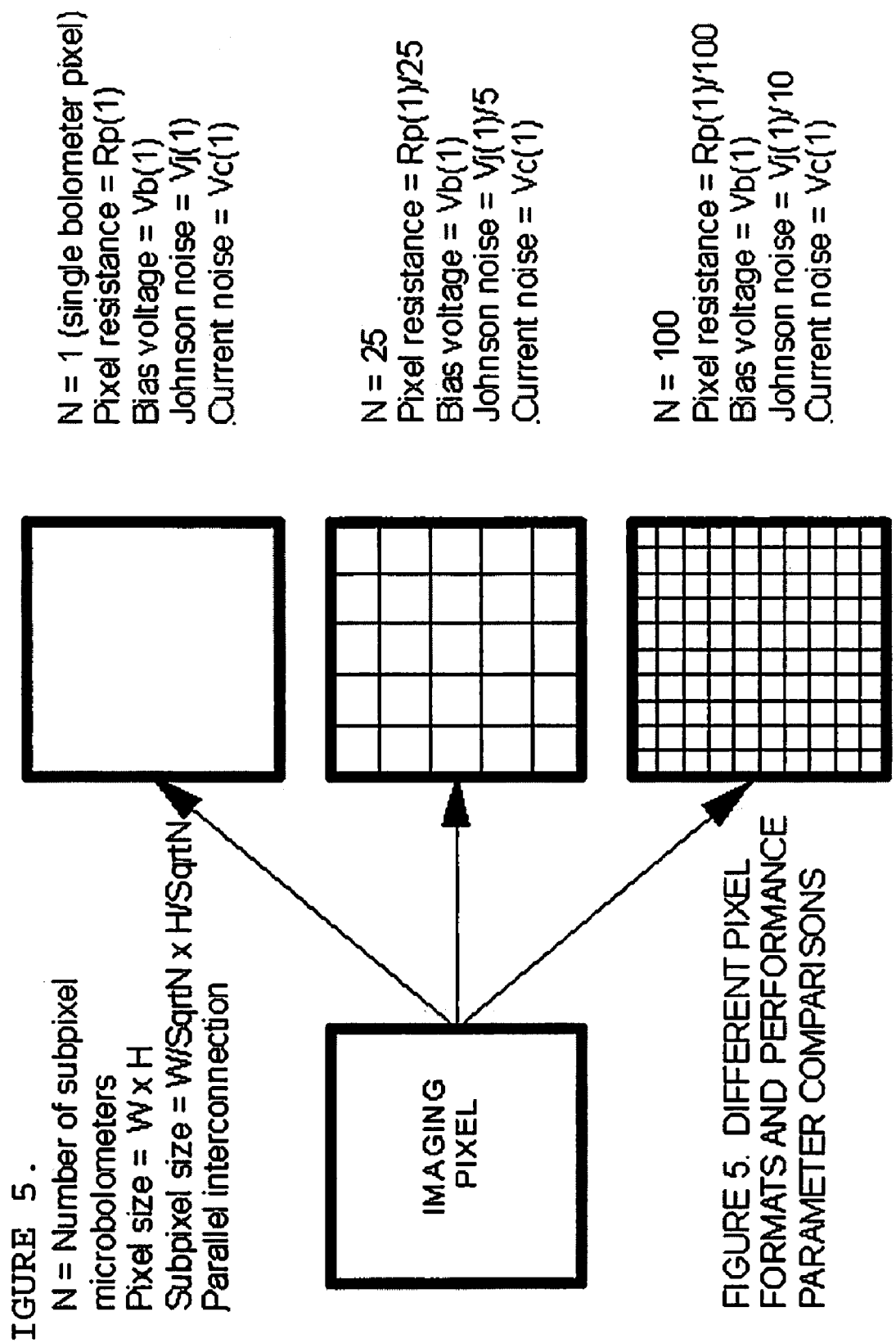
FIGURE 5. DIFFERENT PIXEL FORMATS AND PERFORMANCE PARAMETER COMPARISONS

MICROBOLOMETER INFRARED SECURITY SENSOR

FIELD OF THE INVENTION

The present invention relates to an infrared security sensor, including a focal plane array (FPA) of resistance microbolometer infrared detectors connected in such a manner to produce different pixel formats to meet specific detection requirements. The FPA may be integrated with a readout microcircuit (ROIC) on the same substrate so that with appropriate signal processing and low cost lens one is capable of forming an image of the field of view of interest, facilitating target recognition and very low false alarm rate.

Typically each imaging pixel may be a mosaic comprising a number of sub-pixels connected in parallel (although other configurations are possible), resulting in enhanced performance and ease of manufacture by micro-fabrication methods. The arrangement of such as mosaic pixel focal plane array will hereinafter be referred to as a MP-FPA.

The present invention also further relates to a method of formulating such an infrared sensor utilising not only novel architecture but also novel fabrication techniques and materials.

BACKGROUND OF THE INVENTION

There are many potential applications for high performance infrared (IR) sensors in the field of security and other related areas in the military, industrial and domestic markets. Current sensors are either too expensive for wide-scale use in this market segment, or have inadequate performance. The common passive infrared (PIR) sensor used widely in security systems is incapable of imaging and produces a simple hot-spot detection of a moving target. These sensors cannot detect stationary targets, or discriminate clearly between a human and other target, and are subject to false alarms. To date there are no IR security sensors known to the inventor that facilitate detection and recognition of targets of interest with minimal false alarms and at an affordable cost acceptable to this market segment. In particular there are no known affordable IR security sensors that are able to detect stationary targets or targets where temperature changes relatively slowly.

It is an object of the present invention to overcome the aforementioned problems and to provide the public with a useful and higher performing alternative to the present PIR sensors.

Accordingly the present invention provides for sensors that facilitate detection and recognition of targets that may be animate, such as human beings, or inanimate, such as a heated area in the field of view that may, for example, indicate the early stages of a fire.

It is a further object of the present invention to provide for sensors that improve on the current ability to detect targets approaching the sensor (which are often undetected with current PIR sensors), and slow temperature rises related to, for example, electrical equipment failure or a developing fire.

SUMMARY OF THE INVENTION

Therefore in one flow of the invention though this need not be the only or indeed the broadest form there is proposed an if security sensor comprising:

a focal plane array (FPA) including a plurality of pixels, whereby each of said pixels includes a mosaic of electrically interconnected sub-pixels, the mosaic of sub-pixels arranged to form a mosaic pixel focal plane array (MP-FPA) and each said sub-pixel being a resistance microbolometer infrared detector;

a signal readout means;

an infra red transmitting lens;

a signal processing means; and a display means.

The focal plane array is mounted in a gas-filled or evacuated package fitted with an infrared transmitting window or lens, and the components of the sensor are chosen as described herein to achieve a higher performance and extended capability compared to existing PIR sensors.

In preference a plurality of arrays can be fabricated on the same substrate by step-and-repeat pattern generation.

In preference said sensor further includes a storage means to store signals measured by the array.

Preferably at least some of the microbolometer infrared detectors are connected to each other in parallel.

In preference at least some of the microbolometer infrared detectors are connected to each other in series.

Preferably the signal processor provides for number, size, shape, speed and direction of movement of detected targets and an alarm registered according to preset threshold.

In preference said infrared security sensor further includes an image display enabling the detected image to be displayed.

Preferably said infrared security sensor includes a matrix of sub-pixels microbolometer detectors, each pixel in the focal plane array comprising a number N sub-pixels, where N may range from 1 (single-detector pixel) to a number determined by the desired performance.

Preferably the focal plane array is formed on a CMOS or thin film transistor (TFT) integrated circuit.

Preferably the microbolometer infrared detector includes heat sensitive material selected from but not limited to doped or undoped amorphous or nanocrystalline silicon or silicon alloy.

Preferably said infrared security sensor provides for an increased pixel bias voltage and reduced Johnson and 1/f noise.

In preference said infrared security sensor provides for use of a microbolometer material having higher temperature coefficient of resistance.

In preference said infrared security sensor further includes a storage means to store signals from the array.

Preferably the optical system is a single or multi-element Fresnel lens or a germanium or chalcogenide glass lens with aspheric or binary surface geometry.

In preference a plurality of focal plane arrays of different pixel formats are included in the same package so as to provide higher optical resolution in some sectors of the field of view or broaden the field of view.

Preferably said infrared security sensor provides for target recognition.

In preference said infrared security sensor provides for detection of developing fire or overheating electrical appliances.

Preferably the output display is monitored locally or remotely via telephone line or radio link to a monitor base.

In a further form of the invention there is proposed a method of detecting an infrared signal using an apparatus as defined in any one of the above preferences and including the step of defocusing or averaging the signal output from adjacent pixels.

BRIEF DESCRIPTION OF THE DRAWINGS

The accompanying drawings, which are incorporated in and constitute a part of this specification, illustrate several implementations of the invention and, together with the description, serve to explain the advantages and principles of the invention. In the drawings.

FIG. 5 illustrates how an imaging pixel of given size can be formed in various MP-FPA formats with different number of sub-pixel microbolometers to enable performance enhancement.

DESCRIPTION OF THE PREFERRED EMBODIMENTS

The following detailed description of the invention refers to the accompanying drawings. Although the description includes exemplary embodiments, other embodiments are possible, and changes may be made to the embodiments described without departing from the spirit and scope of the invention. Wherever possible, the same reference numbers will be used throughout the drawings and the following description to refer to the same and like parts.

Figure 1:
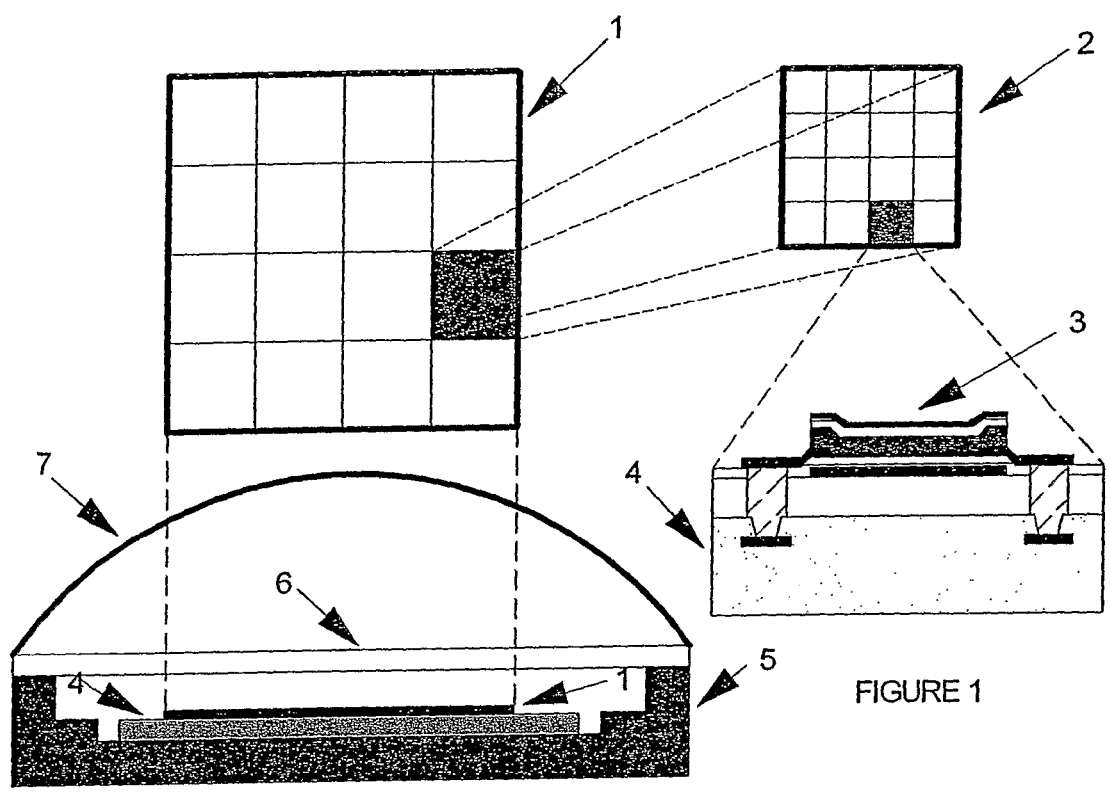
FIG. 1 is a schematic of an imaging array embodying the present invention and illustrating an imaging MP-FPA with each pixel comprising an array of sub-pixels, each sub-pixel being an individual detector element.

Illustrated in FIG. 1 is a MP-FPA 1 in both plan and cross-section comprising an array of 4×4 imaging pixels. Each pixel comprises an array of sub-pixels 2, each sub-pixel 2 being a functional IR detector 3, illustrated in cross-section. In this example there are 4×4 sub-pixels.

The MP-FPA is formed on and integrated with a ROIC 4 and mounted in package 5. The package 5 has an IR transmitting window 6 and is coupled to an IR lens 7. In some instances, the lens 7 may fit directly to the package 5 so that the window 6 is not required. The MP-FPA may be packaged at atmospheric pressure in suitable filling gas such as nitrogen or xenon using simplified packaging. Where higher performance is required, it may be packaged in vacuum using wafer level packaging.

Typically a number of FPA's will be fabricated at the same time on a single substrate. Different array formats may also be fabricated on the same substrate. In particular, it is advantageous to fabricate arrays with different numbers of imaging pixels, but the same number of sub-pixels, the former varying only in the manner in which the sub-pixels are interconnected.

For example, a generic 160×120 format FPA could have 160×120 pixels, each pixel comprising a single detector; alternatively 40×30 pixels, each pixel comprising 4×4 sub-pixel detectors.

In some applications it may be desirable to include two or more arrays of identical or different pixel format in the same sensor, in order to increase the overall field of view or have a higher resolution in some sectors. These multi-arrays may be diced from the same wafer.

The lens 7 is typically a single or multi-element plastic Fresnel lens or other plastic lens design or a single lens of germanium, silicon or a chalcogenide glass, with aspheric/binary surface geometry. The lens may be plan-convex, so designed with a short back focal length to enable mounting directly onto the FPA package.

The actual pixel format of an FPA depends on the specific application. The size and number of imaging pixels will be determined, respectively, by the target size and range, and the desired overall field of view.

For example, if it were desired to detect a target of dimensions 1 m×1 nm at a distance of 100 m, then for a lens of focal length 20 mm the required pixel size is 200 μm×200 μm. For the array of FIG. 1, the sub-pixel size would be 50 μm×50 μm. The overall field of view would be 4 m×4 m at 100 meter ranges or an angular field of about 2.3 degrees. In practice there would be many more pixels in the array in order to achieve a suitably large field of view.

Figure 2:
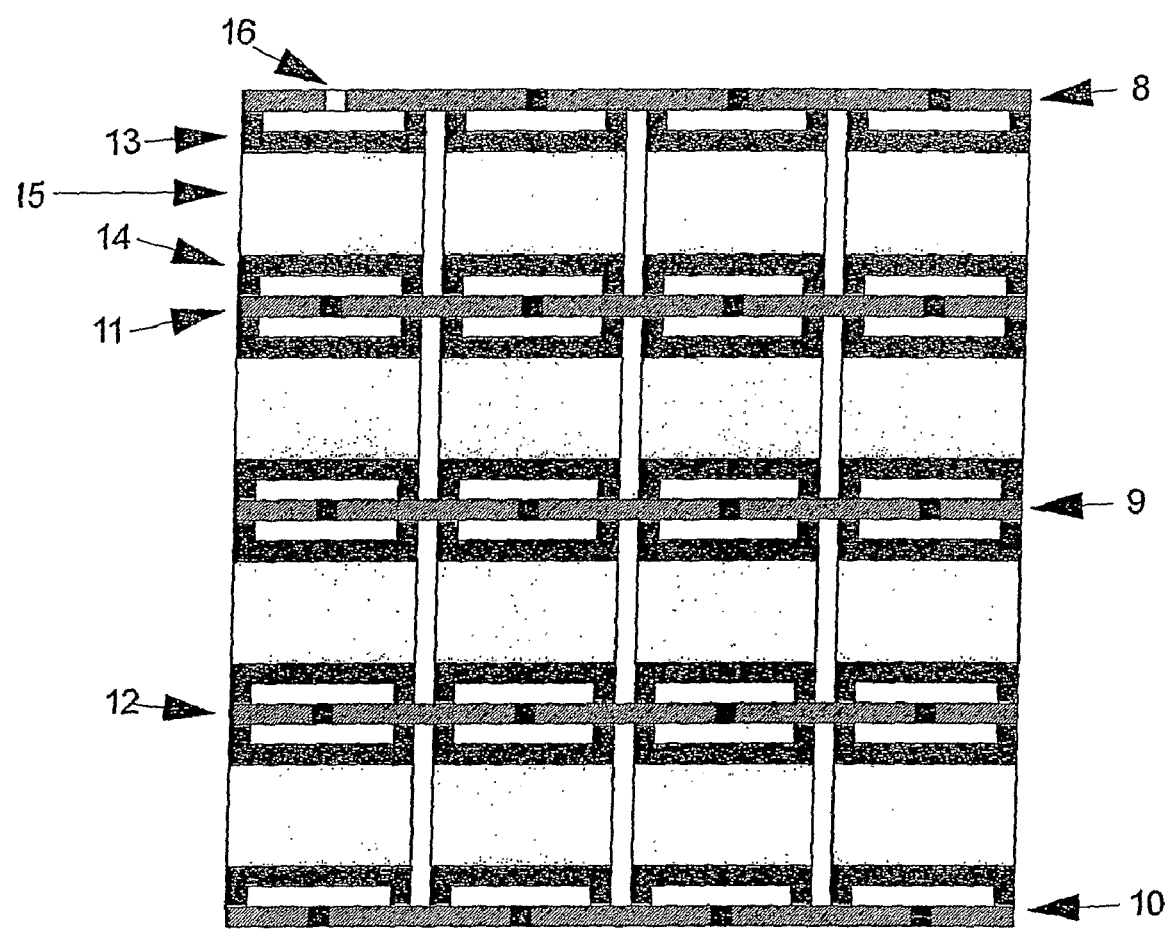
FIG. 2 illustrates how groups of sub-pixels may be connected to form imaging pixels.

FIG. 2 illustrates in plan view how sub-pixels may be interconnected, although other layouts are possible. Continuing with the 4×4 array example of FIG. 1, thin-film electrical interconnect rails 8, 9, and 10 are biased at positive potential, and rails 11 and 12 at negative (ground) potential. At each of the sixteen sub-pixel detectors, contact electrodes 13 connect the detector body 15 to the interconnect rails 8, 9 and 10, and contact electrodes 14 connect the detector body to the interconnect rails 11 and 12; thus electrically the detectors are wired in parallel. The entire structure is supported above the ROIC by electrically conducting columns 16. It is possible with this specific design format to achieve a high optical fill factor, thus maximising the IR absorption area.

It is important to note that if there is a fault in one of the sub-pixels, the pixel will remain functional. This redundancy in operation is but one important feature of the invention, and has a significant impact on process yield, hence production cost.

A further advantage of using parallel network is that the pixel electrical resistance is much less than the sub-pixel resistance, which allows pixel resistance to be best matched to the ROIC input whilst using a higher resistivity detector material, and thus a higher Temperature Coefficient of Resistance (TCR). See also the discussion following equation (2) below.

The resistance network is, however, not limited to parallel connection. Optionally, it may be desirable to employ a series network, for example to increase resistance when employing a high conductivity detector material; and the best solution in specific FPA designs may be a parallel-series network.

Figure 3:
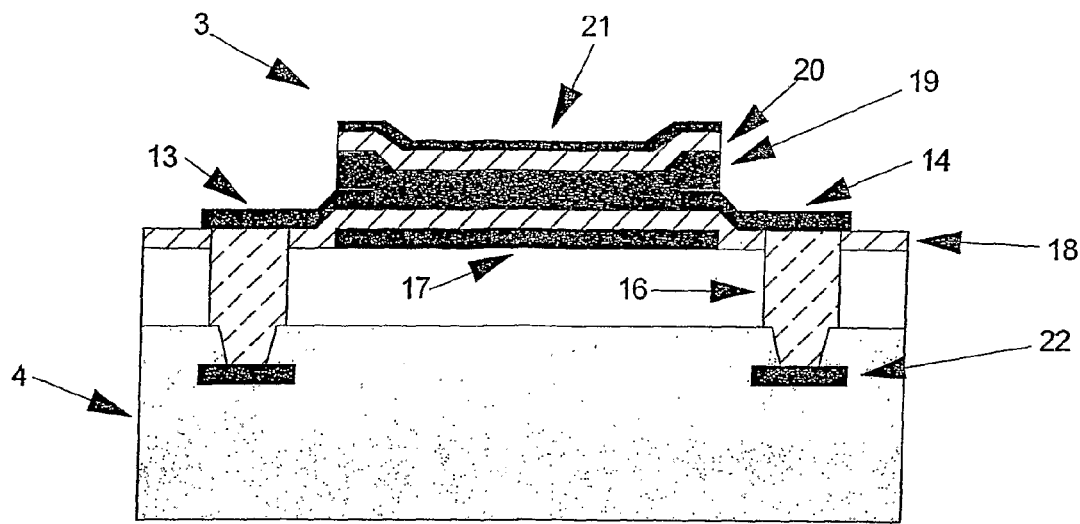
FIG. 3 is a schematic diagram of an individual sub-pixel detector element.

FIG. 3 illustrates a cross-section schematic of a sub-pixel detector. The detector body 3 is supported on conducting pillars 16, above the associated ROIC 4. The body 3 is comprised of a thin metal reflector 17, on which is deposited an insulating layer 18. Two metal contact electrodes 13 and 14 make electrical contact to a thin-film semiconductor heat-sensitive layer 19. The structure further includes a second insulator 20 and a thin top metal film 21. The conducting pillars 16 make contact with the ROIC 4 through metal pads 22. The 'detector stack', comprising reflector-insulator-semiconductor-insulator-top metal, forms an integral optical cavity tuned for maximum IR absorption at 10 μm wavelength.

The detector body is formed by micro-engineering (MEMS) techniques on a polyimide sacrificial layer (not shown), which is subsequently removed by plasma ashing.

In preference, the semiconductor layer is an amorphous silicon alloy or doped hydrogenated amorphous silicon, the two insulator layers are silicon nitride, and the metal contacts (which also form the thermal loss path from detector body to heat sink) are a 60:40 Ni—Cr alloy (nichrome) or titanium. The reflector is aluminium. The metal pillars are aluminium or a dual Ti:Pt metallisation. The top metal is nichrome, titanium or platinum. These layers will be deposited by plasma-enhanced chemical vapour deposition (PECVD) or physical vapour deposition (PVD). The layers are patterned by conventional microlithography and dry etching.

Amorphous silicon and its alloys can be modified to favourably enhance performance for security sensor applications, for example by varying electrical conductivity. Amorphous silicon-hydrogen alloy (a-Si:H) can be doped to increase conductivity allowing the desired electrical resistance to be obtained. There is a limit to the conductivity which can be achieved in this manner, but a higher conductivity may be obtained by forming an alloy of silicon with phosphorous or boron, where these elements are alloyed rather than act as dopants. Other alloys with silicon include tin, antimony, indium, germanium and gallium.

A further option is to deposit a doped or undoped a-Si:H layer in such a manner to grow the crystal size, resulting in higher conductivity. In this form, the material is commonly called nanocrystalline or microcrystalline silicon.

There are two main reasons for seeking a higher conductivity semiconductor material: to reduce the electrical resistance of bolometers to better match the readout circuit, and to reduce electrical noise, hence to achieve enhanced detective performance.

Figure 4:
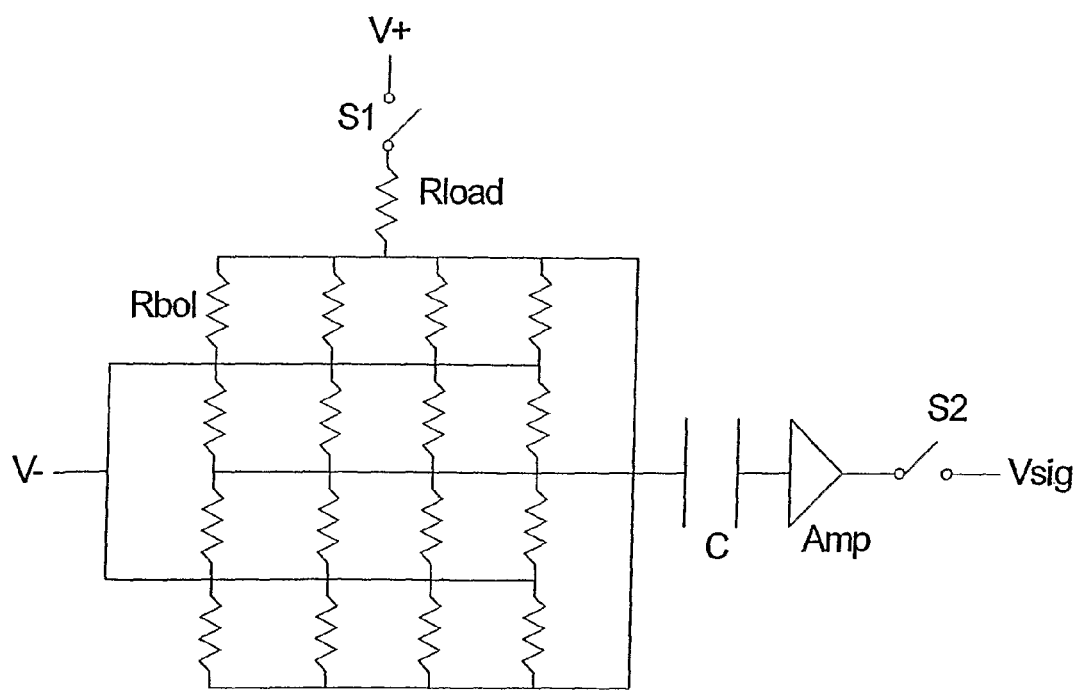
FIG. 4 is a typical example of how a pixel may be electrically connected and readout out from the FPA.

FIG. 4 illustrates electronically how detector sub-pixels may be connected to form an imaging pixel. In the preferred embodiment, detectors will be connected in parallel. This results in reduced electronic noise whilst retaining a large absorbing area. Continuing the same example of FIG. 1, the 16 sub-pixel detectors, Rbol, are shown in parallel connection, and are wired in series with a bias resistor, Rload. The bias voltage is applied when the switch S1 is closed. The parallel resistance network is connected via a DC blocking capacitance C to a low noise amplifier and signal conditioning circuit labelled Amp, and the signal is read out by switch S2 and digitised. The bias may be direct current alternating current or pulse. It will be understood that FIG. 4 describes a generic electronic configuration, where a number of variations are possible.

The FPA is employed in conjunction with a Digital Signal Processor (DSP) to produce the desired form of output from the sensor. In a preferred embodiment, the signals from the ambient background will be integrated and stored, and a detection alarm will be recorded when the signal from one or more pixels exceeds a preset threshold above ambient. This may be accomplished by synchronous detection, but other methods will be evident to specialists in the field. At the same time, the output may be displayed as an image, enabling visual target recognition. In preference, a signal processing algorithm will be incorporated in the DSP, whereby the size, shape, speed and direction of movement are analysed for the purpose of target recognition; and in preference the number of targets in the field of view will be counted and recorded.

Observers of IR sensors may not wish to see pixelated images. The quality of the image may be improved by removing high spatial frequencies, such as slightly de-focussing the optics, or average the output from adjacent pixels.

In a practical sensor installation, the IR sensor may be employed in conjunction with a visible wavelength CMOS or CCD CCTV camera for day and night operation. During night operation the IR sensor may trigger an illumination source for higher resolution examination with the daylight camera. The IR sensor may be used in a fixed installation to monitor a specific target field such as a wall doorway, path, gate or shop front; but in applications were a wide field of view is required, the sensor may be installed in a pan-tilt-zoom mechanism.

The IR sensor may also be coupled to a data storage device. This would enable a user to examine the data, such as an image, from the device after the event has occurred. In the case of the sensor detecting an intrusion into an area, the operator may be able to review the data to determine the nature of the infusion, for example whether a person or an animal.

It will be understood that the sensor data could be observed locally, in the vicinity of the sensor, or at a remote monitoring station connected to the sensor via telephone, optical or radio link.

In order to further understand the operation and advantages of this invention, it may be noted that for the 8 to 13 µm spectral waveband the commonly used figure of merit for resistance microbolometers, the Noise Equivalent Temperature Difference (NETD), is given by:

$$NETD = 1.715 \times 10^4 \frac{V_n T_{no}^2}{\Re \cdot A_d} \qquad (1)$$

where $V_n$ is total electronic noise, $T_{no}$ is the optical system T number (T/no), $\Re$ the radiant responsivity, and $A_d$ is the radiation receiving area of the pixel. The NETD should be as small as possible, so it is clear that the noise and Tno should also be as small as possible, whilst the responsivity and receiving area should be as large as possible. The Tno is usually chosen to be ~1.0 for optical reasons, and the area is determined by the requirement to resolve the target at the desired detection range.

For short range security sensors, one may compromise between angular resolution and detective performance, by making the area as large as possible whilst retaining the desired resolution. The area is typically in the range 0.01 to 1.0 mm².

The low frequency responsively, expressed in volts per watt, is given by:

$$\Re = \frac{BV\alpha\varepsilon}{G} \qquad (2)$$

where B is a circuit bridge factor, V is the bias voltage, α is the TCR of the temperature sensitive detector material, ε is the detector emissivity (equal to absorptance), and G is the thermal conductance defining heat loss between detectors and the nearby background.

One typically designs the sub-pixel detectors to optimise the values of B, V and G. The value of ε is determined by the design of the detector optical cavity, and is usually of the order 0.8. It is noted that Joule heating usually limits the value of V, but since the electrical resistance of individual sub-pixels may be quite high, the potential exists to use a higher bias voltage compared to other array technologies. Further, as one sees above, the use of a mosaic of sub-pixels provides a means to employ a detector material with a higher value of α. Thus enhancements in responsively are possible with the sensor design described in this specification.

One of the primary objectives of this invention is to minimise the electrical noise, Vn in equation (1), by replacing a single-detector pixel with a mosaic of sub-pixels. The ultimate performance of bolometer detectors is set by thermal fluctuation noise; however, the dominant noise sources are usually Johnson noise and current (1/f) noise. Other minor noise sources such as shot noise may be present, but for the purpose of this discussion the total noise can be considered to be given by:

$$V_n = \sqrt{(V_j^2 + V_{1/f}^2)\Delta f} \quad (3)$$

where Vj is Johnson noise and V1/f is current noise, both expressed in units of V/≈Hz, and $\Delta f$ is the noise bandwidth (Hz).

If the electrical resistance, R, of a single-detector pixel is, for example, the same as each of N sub-pixels, then the resistance of the composite pixel, when the sub-pixels are wired in parallel, is R/N, aid the Johnson noise is reduced by $1/\sqrt{N}$. Thus in FIGS. 1 and 2, the resistance of the composite pixel will be 1/16 of a single-detector pixel, and the Johnson noise will be reduced by a factor 4.

In the case of current noise, according to the well-known Hooge relationship the noise is dependent on the electrical resistivity and volume of the temperature sensitive component, reducing with the square root of resistivity and the inverse square root of volume. For a given material, the volume should thus be as large as possible. It can be shown that the 1/f noise of the sub-pixel mosaic is $1/\sqrt{N}$ that of an individual sub-pixel and the same as a single-detector pixel having the same semiconductor thickness and surface area.

FIG. 5 shows how an imaging pixel of width W and height H can be formed as an MP-FPA with different number of sub-pixels, and how this affects performance. Illustrated are a single bolometer pixel (trivial case, N=1) and two FPA with N=15 and N=100. The sub-pixel microbolometers are of identical design, scaled in size for different values of N. Performance parameters are compared relative to N=1. It is seen that the pixel resistance scales as noted above by R/N, Johnsons noise as $1\sqrt{N}$. The current noise does not change, but is $1\sqrt{N}$ of a sub-pixel microbolometer, thus optimum for the pixel size. The bias voltage for parallel interconnection is also the same in each case; hence whilst the pixel resistance falls with N, the bias voltage can be maintained without increase in Joule heating.

Thus for a given pixel area, the use of an MP-FPA design results in a substantial reduction in electronic noise, compared to that of a single-detector pixel of the same area, or that of a sub-pixel detector. In addition, electronic noise can be further reduced by using a semiconductor material of lower electrical resistivity (higher conductivity), as described above. This results in a lower resistance, hence reduced Johnson noise, and lower 1/f noise as a consequence of the Hooge relationship.

The noise bandwidth will be determined by the sampling (integration time) per pixel, which in turn depends on the number of pixels and the frame time. Thus a further advantage of an IR security sensor, where a given optical field of view is imaged by fewer and larger pixels than higher resolution imagers, is a reduced noise bandwidth hence lower total noise.

The enhanced performance provided by an increase in responsively, reduced noise and larger pixel area is a feature of this invention, and in some applications allows the specified performance to be achieved without evacuation, thus offering the potential for use of low cost gas-filled packaging and cheap plastic lens.

Indeed, the detective performance and spatial resolution of a gas-filled sensor with plastic lens are vastly superior to that of current PIR security sensors, offering higher performance at similar cost. Furthermore, the same MP-FPA packaged in vacuum and used with a good quality germanium or chalcogenide lens is capable of a significantly lower NETD compared to existing IR microbolometer imagers having conventional FPA.

The thermal speed of response of a bolometer detector is the ratio of thermal capacitance to thermal conductance. It can be readily shown that the response time of the parallel-connected sub-pixel mosaic is similar to that of a single-element detector of the same pixel size.

The bolometer element shown in FIG. 3 is a conventional resistance microbolometer. In an alternative embodiment the sub-pixel mosaic may be formed with active microbolometers, which function as a thin film field effect transistor (TFT), where the temperature sensitive resistive component is the channel resistance of the transistor. Sub-pixels and readout components may advantageously be fabricated with the same TFT technology on plain silicon, glass or other suitable substrate, giving significant economies in fabrication cost. The detector element and readout components may be optionally fabricated as thin film JFET and/or p-i-n diodes.

In summary, the present invention offers a number of advantages over existing security sensor technology including but not necessarily limited to:

a. accommodating target size, shape, speed and direction of movement
   b. provision of an imaging capability
   c. target recognition
   d. very low false alarm rate
   e. detection of stationary and approaching targets
   f. detection of slowly heating or cooling targets
   g. array redundancy and low failure rate
   h. novel low cost fabrication
   These advantages may be achieved with a superior detective performance and higher spatial resolution compared to existing PIR security sensors, effectively defining a new generation of such sensors.

Further advantages and improvements may very well be made to the present invention without deviating from its scope. Although the invention has been shown and described in what is conceived to be the most practical and preferred embodiment it is recognized that departures may be made therefrom within the scope and spirit of the invention, which is not to be limited to the details disclosed herein but is to be accorded the full scope of the claims, so as to embrace any and all equivalent devices and apparatus.

In any claims that follow and in the summary of the invention, except where the context requires otherwise due to express language or necessary implication, the word "comprising" is used in the sense of "including" i.e. the features specified may be associated with further features in various embodiments of the invention.

The invention claimed is:

1. A passive infrared (PIR) security sensor comprising:
   a focal plane array (FPA) including a plurality of imaging pixels, each of said pixels including a mosaic of sub-pixels that are electrically interconnected within the focal plane to form a resistor network, the mosaic of sub-pixels being arranged to form a mosaic pixel focal plane array (MP-FPA) and each said sub-pixel being a resistance microbolometer infrared detector;
   a signal readout means;
   an infra red transmitting lens;
   a signal processing means; and
   a display means.

2. An infrared security sensor as in claim 1 wherein at least some of the microbolometer infrared detectors are connected to each other in parallel.

3. An infrared security sensor as in claim 1 wherein at least some of the microbolometer infrared detectors are connected to each other in series.

4. An infrared sensor as in claim 1 where a plurality of focal plane arrays of different pixel formats are included in the same package so as to provide higher optical resolution in some sectors of the field of view or broaden the field of view.

5. An infrared security sensor as in claim 1 whereby the FPA is formed on and electronically integrated with a CMOS or thin film transistor (TFT) readout integrated circuit.

6. An infrared security sensor as in claim 1 whereby said focal plane array is mounted in a gas-filled or evacuated package fitted with a silicon or germanium infrared transmitting window.

7. An infrared security sensor as in claim 1 wherein a plurality of arrays are fabricated on the same substrate by step-and-repeat pattern generation.

8. An infrared security sensor as in claim 1 further including a signal storage means to store signals measured by the array for subsequent retrieval.

9. An infrared security sensor as in claim 1 wherein the signal processor provides for number, size, shape, speed and direction of movement of detected targets and an alarm registered according to preset thresholds.

10. An infrared security sensor as in claim 1 further including an image display enabling the detected image to be displayed.

11. An infrared security sensor as in claim 1 wherein the microbolometer infrared detector includes a heat sensitive material selected from but not limited to doped or undoped amorphous silicon or silicon alloy.

12. An infrared security sensor as in claim 1 wherein the microbolometer infrared detector includes a heat sensitive material selected from but not limited to doped or undoped nanocrystalline silicon or silicon alloy.

13. An infrared security sensor as in claim 1 wherein the sensor has optics that comprises a purpose-designed single or multi-element plastic Fresnel lens or other plastic lens.

14. An infrared security sensor as in claim 1 wherein the sensor has an optical system that is a silicon, germanium or chalcogenide glass lens with optional aspheric or binary surface geometry.

15. An infrared security sensor as in claim 1 where the FPA is packaged at atmospheric pressure in air, nitrogen, xenon or other low thermal conductivity gas.

16. An infrared security sensor as in claim 1 which provides for target recognition.

17. An infrared security sensor as in as in claim 1 whereby the output display is monitored locally or remotely via telephone line or radio link to a monitor base.

18. An infrared security sensor as in claim 1 which provides for detection of developing fire or overheating electrical appliances.

19. An infrared security sensor as in claim 1 further including an integrated CMOS or CCD daylight CCTV camera.

20. An infrared FPA including a plurality of pixels, each pixel in said plurality of pixels including a mosaic of sub-pixel microbolometer detectors, each pixel in the focal plane array comprising a number N sub-pixels electrically interconnected within the focal plane to form a resistor network, where N may range from 2 to a number determined to achieve optimum bias voltage, speed of response and reduced electronic noise.

21. An IR sensor including an FPA as in claim 20, packaged in vacuum and having a germaniumor chalcogenide glass lens to achieve enhanced detective performance.

* * * * *